(12) United States Patent
Ahn et al.

(10) Patent No.: US 9,613,881 B2
(45) Date of Patent: Apr. 4, 2017

(54) SEMICONDUCTOR DEVICE HAVING IMPROVED HEAT-DISSIPATION CHARACTERISTICS

(71) Applicant: SILICONFILE TECHNOLOGIES INC., Gyeonggi-do (KR)

(72) Inventors: Heui Gyun Ahn, Gyeonggi-do (KR); Sang Wook Ahn, Gyeonggi-do (KR); Yong Woon Lee, Gyeonggi-do (KR); Huy Chan Jung, Gyeonggi-do (KR); Sung Chun Jun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/891,629

(22) PCT Filed: May 9, 2014

(86) PCT No.: PCT/KR2014/004180
§ 371 (c)(1),
(2) Date: Nov. 16, 2015

(87) PCT Pub. No.: WO2014/185665
PCT Pub. Date: Nov. 20, 2014

(65) Prior Publication Data
US 2016/0086869 A1    Mar. 24, 2016

(30) Foreign Application Priority Data
May 14, 2013 (KR) .......................... 10-2013-0054090

(51) Int. Cl.
*H01L 27/00* (2006.01)
*H01L 23/367* (2006.01)
*H01L 25/065* (2006.01)
*H01L 23/522* (2006.01)
*H01L 23/58* (2006.01)
*H01L 27/06* (2006.01)

(52) U.S. Cl.
CPC ........ *H01L 23/367* (2013.01); *H01L 23/3677* (2013.01); *H01L 23/522* (2013.01); *H01L 23/5226* (2013.01); *H01L 25/0657* (2013.01); *H01L 23/585* (2013.01); *H01L 27/0688* (2013.01); *H01L 2225/06513* (2013.01); *H01L 2225/06541* (2013.01); *H01L 2225/06589* (2013.01); *H01L 2924/0002* (2013.01)

(58) Field of Classification Search
CPC .................................................. H01L 25/0657
See application file for complete search history.

(56) References Cited

U.S. PATENT DOCUMENTS

2006/0197181 A1* 9/2006 Noguchi ............. H01L 23/3677
257/530

FOREIGN PATENT DOCUMENTS

| KR | 100283636 | 6/2001 |
|---|---|---|
| KR | 1020090071443 | 7/2009 |
| KR | 101069499 | 9/2011 |
| KR | 101142336 | 5/2012 |

\* cited by examiner

*Primary Examiner* — William Harriston
(74) *Attorney, Agent, or Firm* — IP & T Group LLP

(57) ABSTRACT

A semiconductor device having improved heat-dissipation characteristics is capable effectively discharging heat that is generated inside the semiconductor device of a three-dimensional laminated structure, to the outside of the semiconductor device by utilizing an internal connector used during bonding.

21 Claims, 5 Drawing Sheets

SEMICONDUCTOR DEVICE HAVING IMPROVED HEAT-DISSIPATION CHARACTERISTICS

TECHNICAL FIELD

The present invention relates to a semiconductor device and, more specifically, to a semiconductor device having improved heat-dissipation characteristics, which is capable effectively discharging heat, which is generated inside the semiconductor device, to the outside of the semiconductor device by utilizing an internal connector used during bonding.

BACKGROUND ART

A three-dimensional stack package of a packaging technology of a semiconductor integrated circuit includes a plurality of chips, which are stacked, having a same memory storage, and is normally referred to as a stack chip package.

A technology of the chip stack package has advantages to improve a performance of a chip package, reduce a manufacturing cost and be easy of a mass productions by stacking the plurality of chips using a simple manufacturing process. The technology of the chip stack package has disadvantages to be short of a line distribution for an electrical coupling of the chip stack package according as the number or the size of the plurality of chips, which are stacked, increase.

In other words, since a conventional chip stack package is manufactured to couple a bonding pad of each chip to a conductive circuit pattern of a substrate using a wire for an electrical coupling between the bonding pad of each chip and the conductive circuit pattern of the substrate under a circumference where a plurality of chips are stacked in a chip stack region of the substrate, the conventional chip stack package needs an additional space for a wire bonding within a chip package and a conductive circuit pattern of the substrate to which a wire is coupled, and has disadvantages to increase a size of the chip package.

In order to consider these points, a structure using a through-silicon-via (TSV) as an example of a chip stack package has been developed. In recent, a method for forming a through-hole electrode composed of a conductive material within a semiconductor chip and electrically coupling semiconductor chips through the through-hole electrode has been used.

A metal direct bonding process for bonding a metal pad instead of a TSV or a bump bonding process for bonding a bump is used as another embodiment of a method for manufacturing a chip stack package.

Although a heat is generated in a conventional chip stack package having a plurality of chips which are stacked using a TSV, a metal pad and a bump pad according to the increase of an integration of the conventional chip stack package, since a separate heat radiation means is not mounted, the heat generated from the plurality of chips is not efficiently discharged and a performance of a semiconductor device is deteriorated.

DISCLOSURE

Technical Problem

Various embodiments of the present invention are directed to a semiconductor device having improved heat-dissipation characteristics for improving a performance of a semiconductor device by diffusing or discharging a heat, which is generated from a specific region inside the semiconductor device, to an entire region of the semiconductor device through an internal connector used in a bonding between the plurality of chips in the semiconductor device.

Technical Solution

In accordance with an embodiment of the present invention, a semiconductor device having improved heat-dissipation characteristics includes a first semiconductor chip having a plurality of dummy connectors and a plurality of Internal connectors for an electrical coupling of an internal circuit formed in a first semiconductor substrate; and a second semiconductor chip having a plurality of dummy connectors and a plurality of internal connectors for an electrical coupling of an internal circuit formed in a second semiconductor substrate, and stacked on an upper portion of the first semiconductor chip, wherein at least one of the plurality of dummy connectors of the first semiconductor chip is coupled through a routing of a dummy metal distribution line of the first semiconductor chip, and at least one of the plurality of dummy connectors of the second semiconductor chip is coupled through a routing of a dummy metal distribution line of the second semiconductor chip, and wherein a heat generated from a hot spot of the semiconductor device is dissipated to an entire portion of the semiconductor device through the dummy metal distribution line and the dummy connector.

In accordance with another embodiment of the present invention, a semiconductor device having improved heat-dissipation characteristics includes a semiconductor chip including a plurality of dummy connectors and a plurality of internal connectors for an electrical coupling of an internal circuit formed in a semiconductor substrate, wherein at least one of the plurality of dummy connectors is coupled through a routing of the dummy metal distribution line, and a heat generated from a hot spot of the semiconductor device is dissipated to an entire portion of the semiconductor device through the dummy connector and the dummy metal distribution line.

Advantageous Effects

A semiconductor device having improved heat-dissipation characteristics in accordance with embodiments of the present invention prevents a performance of the semiconductor device from being deteriorated by effectively discharging heat, which is generated inside the semiconductor device, to the outside of the semiconductor device through an internal connector used between semiconductor chips during bonding.

Moreover, a semiconductor device in accordance with embodiments of the present invention improves heat-dissipation characteristic utilizing a dummy connector added by a manufacturing process purpose or a design request.

BEST MODE

Hereinafter, various embodiments will be described below in more detail with reference to the accompanying drawings.

Figure 1:
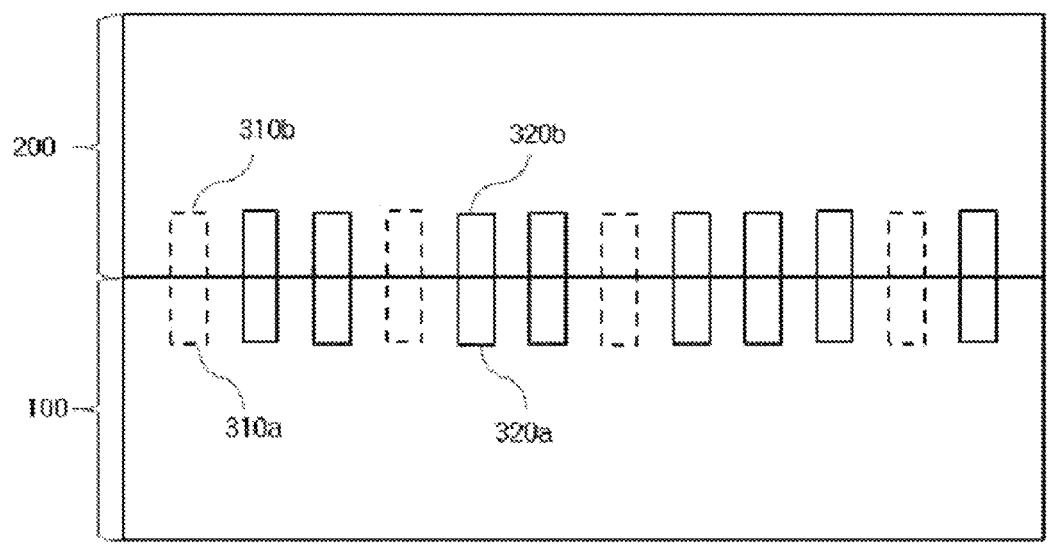
FIG. 1 is a cross sectional view of a semiconductor device having a three-dimensional laminated structure.
Figure 2:
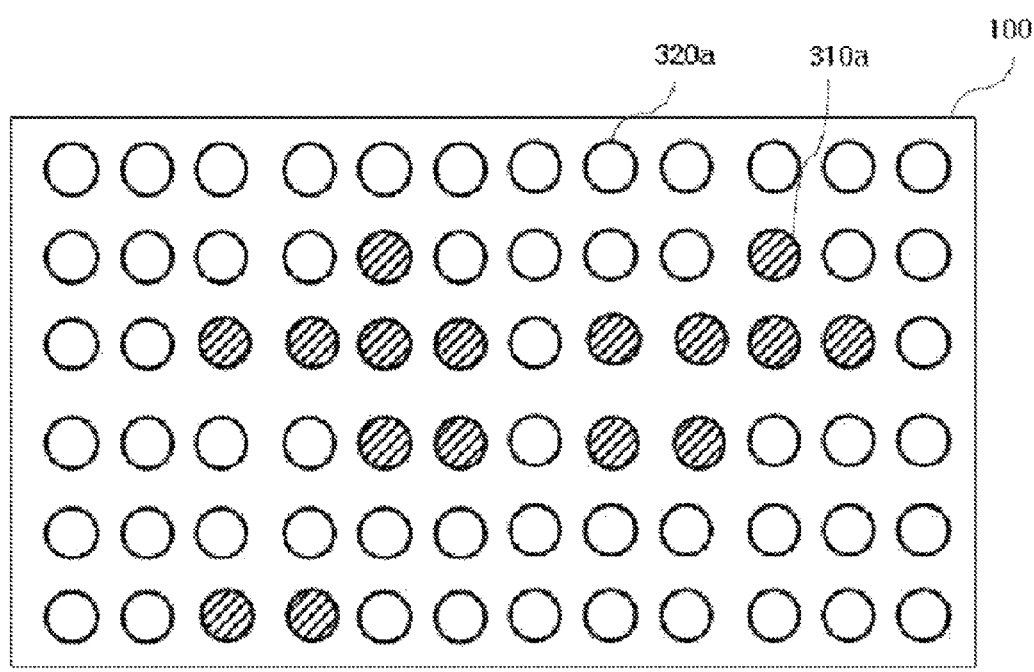
FIG. 2 is a plane view of a cross section along A-A' line in a semiconductor device having a three-dimensional laminated structure shown in FIG. 1.

FIG. 1 is a cross sectional view of a semiconductor device having a three-dimensional laminated structure, and FIG. 2 is a plane view of a cross section along A-A' line in a semiconductor device having a three-dimensional laminated structure shown in FIG. 1.

Referring to FIGS. 1 and 2, a semiconductor device having improved heat-dissipation characteristics includes a first semiconductor chip 100 and a second semiconductor chip 200, which are stacked.

The first semiconductor chip 100 and the second semiconductor chip 200 include an internal connector and a dummy connector, respectively. An internal connector 310a of the first semiconductor chip 100 is bonded to an internal connector 310b of the second semiconductor chip 200, and a dummy connector 320a of the first semiconductor chip 100 is bonded to a dummy connector 320b of the second semiconductor chip 100.

A connector is a generic term representing means for electrically coupling a first semiconductor chip to a second semiconductor chip in a semiconductor device of a three-dimensional laminated structure including a bump, a TSV or a metal pad.

The connector may be classified into the internal connector 310a or 310b used for an electrical circuit configuration between the first semiconductor chip 100 and the second semiconductor chip 200, and the dummy connector 320a or 320b) used for a manufacturing process purpose or a different design purpose.

It is a general to regularly dispose a dummy connector in an insulation layer to acquire uniformity in a planarizing process, e.g., chemical mechanical polishing (CMP) or a bonding process.

A heat generated from a specific region inside the semiconductor device is dissipated to an entire region of the semiconductor by electrically coupling a lower portion of the dummy connectors 320a and 320b, which are additionally disposed, to each other using a dummy metal line.

If a heat is concentrated to a hot spot, since it is difficult to prevent a semiconductor device from being deteriorated, a semiconductor device having improved heat-dissipation characteristics in accordance with embodiments of the present invention remove the occurrence of the hot spot.

Figure 3:
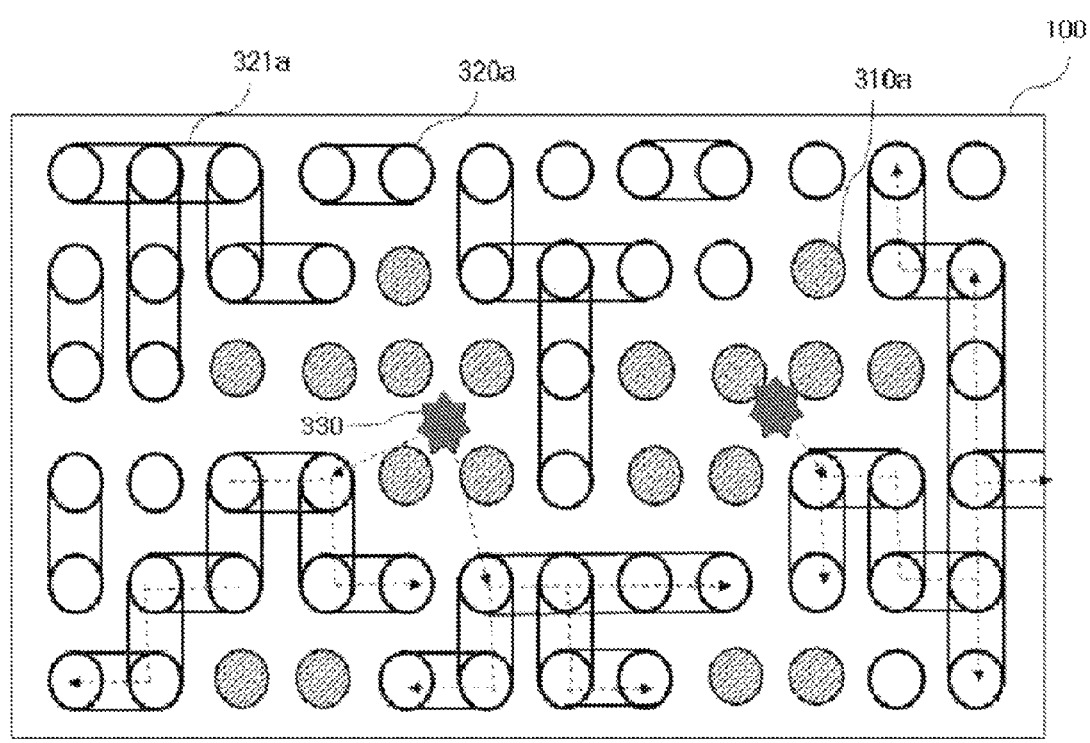
FIG. 3 is a diagram illustrating a heat-dissipation process using a dummy connector in a semiconductor device having an improved heat-dissipation in accordance with an embodiment of the present invention.
Figure 4:
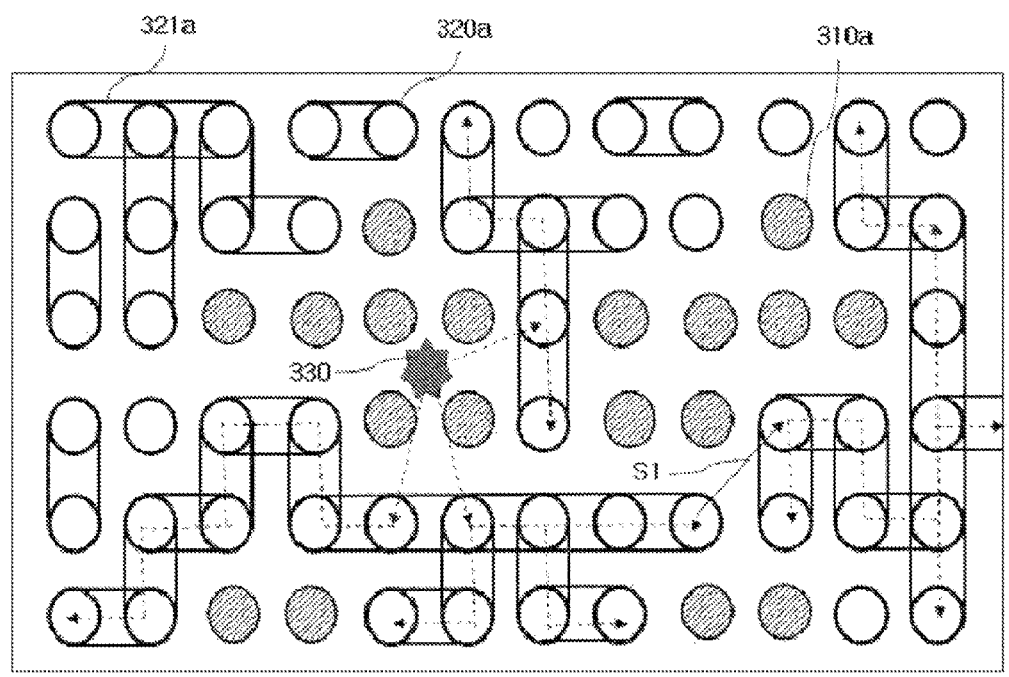
FIG. 4 is a diagram illustrating a heat-dissipation process using a dummy connector in a semiconductor device having an improved heat-dissipation in accordance with another embodiment of the present invention.

FIGS. 3 and 4 are diagrams illustrating a heat-dissipation process using a dummy connector in a semiconductor device having an improved heat-dissipation in accordance with embodiments of the present invention.

A routing of a metal line, which couples an internal connector 310a for the convenience of the descriptions is omitted.

Referring to FIG. 3, the heat generated from a hot spot 330 is dissipated through a dummy metal distribution line 321a and a dummy connector 320a, and the hot spot of the semiconductor device is disappeared.

Referring to FIG. 4, the heat transferred to the dummy metal distribution line 321a and the dummy connector 320a according to a routing characteristic of a dummy metal distribution line 321a may be additionally dissipated through the dummy metal distribution line and the dummy connector S1. The heat-dissipation characteristic may be further improved.

Figure 5:
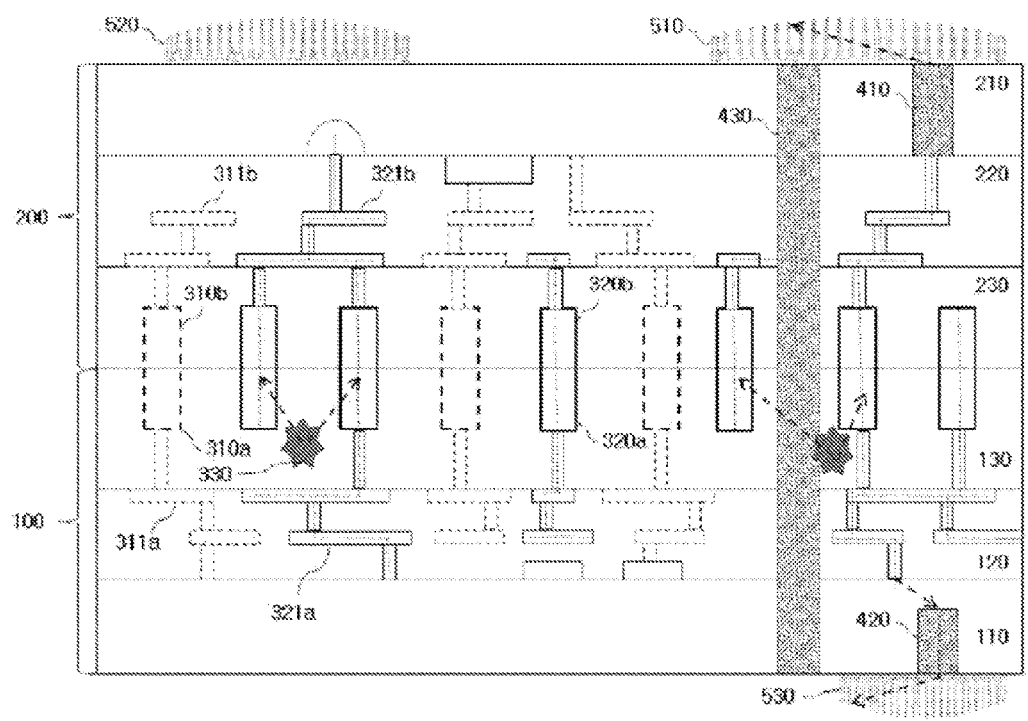
FIG. 5 is a cross sectional view of a semiconductor device having an improved heat-dissipation in accordance with an embodiment of the present invention.

FIG. 5 is a cross sectional view of a semiconductor device having an improved heat-dissipation in accordance with an embodiment of the present invention.

Referring to FIG. 5, a semiconductor device having an improved heat-dissipation in accordance with an embodiment of the present invention includes a first semiconductor chip 100 and a second semiconductor chip 200, which is stacked on an upper surface of the first semiconductor chip 100.

The first semiconductor chip 100 includes a first semiconductor substrate 110, an insulation layer 120 and an oxide layer 130, which are formed on the first semiconductor substrate 110, and further includes a plurality of internal connectors 310a and a plurality of dummy connectors 320a for an electrical coupling.

The second semiconductor chip 200 includes a second semiconductor substrate 210, an insulation layer 220 and an oxide layer 230, which are formed on the second semiconductor substrate 210, and further includes a plurality of internal connectors 310b and a plurality of dummy connectors 320b for an electrical coupling.

At least one of the plurality of dummy connectors 320a of the first semiconductor chip 100 is coupled through a routing of a dummy metal distribution line 321a, and at least one of the plurality of dummy connectors 320b of the second semiconductor chip 200 is coupled through a routing of a dummy metal distribution line 321b.

Herein, the dummy connector coupling is formed between at least two dummy connectors according to a circuit configuration and a metal distribution inside the semiconductor chip, and may be formed by coupling entire dummy connectors.

Meanwhile, a semiconductor device in accordance with an embodiment of the present invention dissipates the heat generated from the hot spot 330 of the semiconductor device to outside the semiconductor device through the dummy connectors 320a and 320b and the dummy metal distribution lines 321a and 321b.

The internal connectors 310a and 310b electrically couples a signal between the first semiconductor chip 100 and the second semiconductor chip 200, and the dummy connectors 320a and 320b ace coupled to each other and dissipate the heat generated from the hot spot.

A heat-dissipation effect in accordance with embodiments of the present invention may be applied to not only a semiconductor device of a three-dimensional laminated structure but also a semiconductor device of a single wafer structure. Hereinafter, a semiconductor device of three-dimensional laminated structure will be described.

In the semiconductor device in accordance with embodiments of the present invention, a material for coupling a signal between laminated semiconductor chips may be used for the internal connectors 310a and 310b. It is preferred that one of a bump, a TSV and a metal pad is used as the material for the signal coupling.

In the embodiments of the present invention, the dummy connectors 320a and 320b are coupled to each other by the dummy metal distribution lines 321a and 321b. Herein, the coupling may formed between the dummy connectors 320a and 320b and the dummy metal distribution lines 321a and 321b irrespective of a vertical direction and a horizontal direction within a range which does not affect an operation of a circuit.

The coupled dummy connectors 320a and 320b are used as heat spreaders. The heat generated from the hot spot 330 is transferred from the dummy connectors 320a and 320b to neighboring dummy connectors 320a and 320b via insulation layers 120 and 220, and thereby is dissipated to the entire portion of the semiconductor device.

The heat transferred to the neighboring dummy connectors 320a and 320b is transferred to the first semiconductor substrate 110 and the second semiconductor substrate 210. Herein, the first semiconductor substrate 110 and the second semiconductor substrate 210 may be used as a heat sink.

Meanwhile, it is preferred that separate heat sinks 510 to 530 are disposed outside at least one semiconductor substrate of the first semiconductor substrate 110 and the second semiconductor substrate 210, and the heat dissipated to the entire portion of the semiconductor device is discharged outside the semiconductor device.

The dummy metal distribution lines coupled to the dummy connectors are coupled to at least one of the first semiconductor chip 100 and the second semiconductor chip 200. It is preferred that the TSV 410, 420 and 420 for discharging the heat, which is dissipated to the entire portion of the semiconductor chip, to outside the semiconductor chip are further disposed.

The heat dissipated by the dummy connectors 320a and 320b coupled to the dummy metal distribution lines 321a and 321b is discharged to outside the semiconductor device through the TSVs 410, 420 and 430.

If separate heat sinks 510 and 530 are disposed to a termination terminal of the TSVs 410, 420 and 430, which are exposed to outside the semiconductor device, a heat-dissipation effect of the semiconductor device may be further improved.

The TSV 410 may be directly coupled to the dummy metal distribution line 321b. In this case, the heat transferred to the dummy metal distribution line 321b is discharged to outside the semiconductor device through an electrical insulation from the second semiconductor substrate 210.

In case that the TSV 420 is not directly coupled to the dummy metal distribution line 321a and forms a junction with the first semiconductor substrate 110, the heat transferred to the dummy metal distribution line 321a is discharged outside the semiconductor device via the first semiconductor substrate 100 and the TSV 420.

Meanwhile, the TSV 430 may be formed by penetrating the first semiconductor chip 100 and the second semiconductor chip 200. In this case, the heat transferred through the dummy metal distribution line 321a is discharged to outside the first semiconductor substrate 110 and the second semiconductor substrate 210 through the TSV 430 by an electrical insulation between the first semiconductor substrate 110 and the second semiconductor substrate 210.

If the dummy metal distribution lines 321a and 321b coupled to the dummy connectors 320a and 320b are exposed to a side plane of the first semiconductor chip 100 or the second semiconductor chip 200, the heat transferred to the dummy metal distribution lines 321a and 321b may be discharged outside the semiconductor device through the side plane of the first semiconductor chip 100 or the second semiconductor chip 200.

Herein, if the heat sink is additionally disposed on the side plane of the semiconductor chip, the heat-dissipation effect may be further improved.

Meanwhile, although a part of the dummy metal distribution line of the first semiconductor chip is not shown in drawings, the part of the dummy metal distribution line of the first semiconductor chip may be coupled to a signal supply line or a power supply line for supplying a power to an internal circuit of the first semiconductor chip. Moreover, a part of the dummy metal distribution line of the second semiconductor chip may be coupled to a signal supply line or a power supply line for supplying a power to an internal circuit of the second semiconductor chip.

In case that the dummy metal distribution is coupled to the power supply line or the signal supply line, a resistance element of the power supply line or the signal supply line may be reduced.

Although various embodiments have been described for illustrative purposes, it will be apparent to those skilled in the art that various changes and modifications may be made without departing from the spirit and scope of the invention as defined in the following claims.

What is claimed is:

1. A semiconductor device having improved heat-dissipation characteristics, comprising:
   a first semiconductor chip having a plurality of dummy connectors and a plurality of internal connectors for an electrical coupling of an internal circuit formed in a first semiconductor substrate; and
   a second semiconductor chip having a plurality of dummy connectors and a plurality of internal connectors for an electrical coupling of an internal circuit formed in a second semiconductor substrate, and stacked on an upper portion of the first semiconductor chip,
   wherein at least one of the plurality of dummy connectors of the first semiconductor chip is coupled through a routing of a dummy metal distribution line of the first semiconductor chip, and at least one of the plurality of dummy connectors of the second semiconductor chip is coupled through a routing of a dummy metal distribution line of the second semiconductor chip,
   wherein a heat generated from a hot spot of the semiconductor device is dissipated to an entire portion of the semiconductor device through the dummy metal distribution line and the dummy connector, and
   wherein a through-silicon via (TSV) for discharging a heat, which is dissipated to the semiconductor device, to outside the semiconductor device is further disposed in at least one of the first semiconductor chip and the second semiconductor chip, and wherein the TSV is coupled to the dummy metal distribution line coupled to the dummy connector.

2. The semiconductor device having improved heat-dissipation characteristics of claim 1, wherein the internal connector couples a signal between the first semiconductor chip and the second semiconductor chip.

3. The semiconductor device having improved heat-dissipation characteristics of claim 1, wherein each of the internal connector and the dummy connector is one of a bump, a through-silicon via (TSV) and a metal pad.

4. The semiconductor device having improved heat-dissipation characteristics of claim 1, wherein the first semiconductor substrate and the second semiconductor substrate performs a function of discharging the heat, which is dissipated to the entire portion of the semiconductor device, to outside the semiconductor device.

5. The semiconductor device having improved heat-dissipation characteristics of claim 1, wherein a heat sink is further disposed in at least one of the first semiconductor substrate and the second semiconductor substrate.

6. The semiconductor device having improved heat-dissipation characteristics of claim 1, wherein a heat sink is further disposed in a termination terminal of the TSV.

7. The semiconductor device having improved heat-dissipation characteristics of claim 1, wherein the dummy metal distribution line is directly coupled to the TSV.

8. The semiconductor device having improved heat-dissipation characteristics of claim 1, wherein the dummy metal distribution line is indirectly coupled to the TSV through the first semiconductor substrate or the second semiconductor substrate.

9. The semiconductor device having improved heat-dissipation characteristics of claim 1, wherein the dummy metal distribution line coupled to the dummy connectors is exposed to a side plane of at least one of the first semiconductor chip and the second semiconductor chip.

10. The semiconductor device having improved heat-dissipation characteristics of claim 9, wherein a heat sink is further disposed on the dummy metal distribution line, which is exposed to the side plane of at least one of the first semiconductor chip and the second semiconductor chip.

11. The semiconductor device having improved heat-dissipation characteristics of claim 1, wherein the dummy metal distribution line of the first semiconductor chip is coupled to a signal supply line or a power supply line of an internal circuit of the first semiconductor chip, and the dummy metal distribution line of the second semiconductor chip is coupled to a signal supply line or a power supply line of an internal circuit of the second semiconductor chip.

12. A semiconductor device having improved heat-dissipation characteristics, comprising:
a semiconductor chip including a plurality of dummy connectors and a plurality of internal connectors for an electrical coupling of an internal circuit formed in a semiconductor substrate,
wherein at least one of the plurality of dummy connectors is coupled through a routing of the dummy metal distribution line, and a heat generated from a hot spot of the semiconductor device is dissipated to an entire portion of the semiconductor device through the dummy connector and the dummy metal distribution line, and
wherein a through-silicon via (TSV) for discharging a heat, which is dissipated to the semiconductor device, to outside the semiconductor device is further disposed in the semiconductor chip, and wherein the TSV is coupled to the dummy metal distribution line coupled to the dummy connector.

13. The semiconductor device having improved heat-dissipation characteristics of claim 12, wherein each of the internal connector and the dummy connector is one of a bump, a through-silicon via (TSV) and a metal pad.

14. The semiconductor device having improved heat-dissipation characteristics of claim 12, wherein the semiconductor substrate performs a function of discharging the heat, which is dissipated to the entire portion of the semiconductor device, to outside the semiconductor device.

15. The semiconductor device having improved heat-dissipation characteristics of claim 12, wherein a heat sink is further disposed in the semiconductor substrate.

16. The semiconductor device having improved heat-dissipation characteristics of claim 12, wherein a heat sink is further disposed in a termination terminal of the TSV.

17. The semiconductor device having improved heat-dissipation characteristics of claim 12, wherein the dummy metal distribution line is directly coupled to the TSV.

18. The semiconductor device having improved heat-dissipation characteristics of claim 12, wherein the dummy metal distribution line is indirectly coupled to the TSV through the semiconductor substrate.

19. The semiconductor device having improved heat-dissipation characteristics of claim 12, wherein the dummy metal distribution line coupled to the dummy connectors is exposed to a side plane of the semiconductor chip.

20. The semiconductor device having improved heat-dissipation characteristics of claim 19, wherein a heat sink is further disposed on the dummy metal distribution line, which is exposed to the side plane of the semiconductor chip.

21. The semiconductor device having improved heat-dissipation characteristics of claim 12, wherein the dummy metal distribution line of the semiconductor chip is coupled to a signal supply line or a power supply line of an internal circuit of the semiconductor chip.

* * * * *